US008184302B2

(12) United States Patent
Zoller et al.

(10) Patent No.: US 8,184,302 B2
(45) Date of Patent: May 22, 2012

(54) MEASURING SYSTEM FOR OPTICAL MONITORING OF COATING PROCESSES

(75) Inventors: Alfons Zoller, Bad Soden Salmunster (DE); Harro Hagedorn, Frankfurt am Main (DE); Werner Klug, Freigericht (DE)

(73) Assignee: Leybold Optics GmbH (DE)

( * ) Notice: Subject to any disclaimer, the term of this patent is extended or adjusted under 35 U.S.C. 154(b) by 378 days.

(21) Appl. No.: 11/908,204

(22) PCT Filed: Feb. 23, 2006

(86) PCT No.: PCT/EP2006/001667
§ 371 (c)(1),
(2), (4) Date: Aug. 7, 2008

(87) PCT Pub. No.: WO2006/094647
PCT Pub. Date: Sep. 14, 2006

(65) Prior Publication Data
US 2008/0285060 A1    Nov. 20, 2008

(30) Foreign Application Priority Data
Mar. 9, 2005    (DE) .................. 10 2005 010 681

(51) Int. Cl.
*G01B 11/28*    (2006.01)
(52) U.S. Cl. ............... 356/630; 427/8; 427/9; 427/162; 118/726
(58) Field of Classification Search .......... 356/630–632; 427/8, 162, 9; 118/712, 726
See application file for complete search history.

(56) References Cited

U.S. PATENT DOCUMENTS

| 3,892,490 | A  | * | 7/1975 | Uetsuki et al. ............... 356/388 |
| 5,745,240 | A  | * | 4/1998 | Frakso et al. ................ 356/632 |
| 6,338,775 | B1 | * | 1/2002 | Chen ....................... 204/192.11 |
| 7,247,345 | B2 | * | 7/2007 | Takahashi et al. ............ 427/162 |
| 2002/0176097 | A1 | * | 11/2002 | Rodgers ....................... 356/630 |
| 2002/0189542 | A1 | * | 12/2002 | Van Slyke et al. ............ 118/712 |
| 2003/0085115 | A1 |   | 5/2003 | Tani et al. |
| 2004/0026240 | A1 | * | 2/2004 | Shidoji et al. ............ 204/298.03 |

FOREIGN PATENT DOCUMENTS

| EP | 1 251 189 | 10/2002 |
| EP | 1 359 236 | 11/2003 |

(Continued)

OTHER PUBLICATIONS

International Search Report; PCT/EP2006/001667; Apr. 28, 2006.

(Continued)

*Primary Examiner* — Hoa Pham
(74) *Attorney, Agent, or Firm* — Cantor Colburn LLP

(57) ABSTRACT

The invention concerns a measuring system for optical monitoring of coating processes in a vacuum chamber, in which the light source is arranged inside the vacuum chamber between the substrate carrier and a shutter is arranged beneath the substrate carrier and the light-receiving unit is arranged outside the vacuum chamber in the optical path of the light source. The substrate carrier is designed to accept at least one substrate, and it can move across the coasting source in the vacuum chamber, preferably revolving about an axis, whereby the substrate or substrates cross(es) the optical path between the light source and the light-receiving unit for transmission measurement, and the shutter shades a measurement area across the coating source.

32 Claims, 1 Drawing Sheet

FOREIGN PATENT DOCUMENTS

| | | |
|---|---|---|
| FR | 2 281 996 | 3/1976 |
| JP | 63-300933 A | 12/1988 |
| JP | 1183445 | 7/1989 |
| JP | 4-49808 | 4/1992 |
| JP | 5145683 | 6/1993 |
| JP | 7-90584 A | 4/1995 |
| JP | 2003007462 A | 1/2003 |
| JP | 2003147521 | 5/2003 |
| WO | 02063064 | 8/2002 |

OTHER PUBLICATIONS

Proc. of SPIE, vol. 5250, Sep. 30-Oct. 3, 2003; "Ion Assisted Deposition Processes for Precision and Laser Optics", pp. 519-527.

JP Office Action Sep. 29, 2010, JP Pat. App. Nr. 2008-500073__ English Translation (with German Version attached).

* cited by examiner

MEASURING SYSTEM FOR OPTICAL MONITORING OF COATING PROCESSES

TECHNICAL FIELD OF INVENTION

The invention concerns a measuring system for optical monitoring of coating processes in a vacuum chamber, particularly for the measurement of layer thicknesses of coatings applied to substrates during the coating process, that comprises a system for light injection and a light-receiving device.

BRIEF DESCRIPTION OF RELATED ART

For substrates that are coated with thin layers on the size scale of light wavelengths to achieve prescribed optical properties, the layers must be applied with high uniformity and exact layer thicknesses to achieve the prescribed transmission or reflection properties. The layer thickness is determined by transmission and reflection measurements and takes place in situ in order to control the layer thickness precisely To measure such thin layer thicknesses, photometers are frequently used that include a monochromatic transmission or reflection signal of the coated substrate in a measuring phase and a reference signal of the light source of the photometer. Such photometer configurations have the disadvantage that signals are recorded by two different detectors, the drifts of which affect the measurement result, whereby changes in color temperature of the light source can be considered only insufficiently.

To eliminate these shortcomings, EP 0,257,229 B1 proposes producing a measurement phase in a first light guide, a reference phase in another light guide, and a dark phase one after the other by means of a chopper. The recording of light signals in the measuring and reference phases takes place with a common light detector in the same wavelength adjusted with a monochromator so that aging and temperature drift can be compensated by the light source and detector. The dark phase serves to compensate for errors through outside influences and drifts of electronic amplifiers. A processor unit evaluates the signals.

Known measuring systems for optical monitoring systems can be implemented with relative ease in sputter systems with revolving, flat substrate carriers and intermittent coating, as the light path in the vacuum chamber is very short because of the small distance between the coating source and the substrate; a simple spatial separation from the coating source and the measuring system is possible, and a simple arrangement of light source and light receiver outside the vacuum chamber is possible.

If the coating takes place in a vacuum chamber of a steam device and/or by a plasma- or ion-ray-supported process, the coating, ion, or plasma source lies at a greater distance from the substrate, so that the vacuum chamber is considerably larger and the light path for transmission measurements is lengthened. Thus only a small part of the light from the light source gets to the light receiver, and the measuring is disturbed by outside light from the coating, ion, or plasma source.

BRIEF SUMMARY OF THE INVENTION

The task of the invention is to offer a simple measuring system for optical monitoring, suitable for steam devices and/or plasma- or ion-beam-supported processes, with a high measuring precision for transmission measurements of substrates arranged on moving substrate carriers.

The measuring system for optical monitoring of coating processes in a vacuum according to the invention comprises a measuring system in which a light sender is arranged inside the vacuum chamber between the substrate carrier and a shutter is arranged below the substrate carrier. The substrate carrier is designed to receive at least one substrate, and it can be moved in the vacuum chamber across a coating source, preferably revolving about an axis, whereby the substrate or substrates cross(es) the optical path between the light sender and the light-receiving unit for transmission measurement and the shutter shades a measurement area on the coating source.

The measuring system for in situ monitoring is particularly suitable for transmission measurements on substrates in a vacuum-coating implementation in which coating takes place by means of steaming of coating materials, for example electron-beam steaming or by means of plasma- or ion-beam-supported PVD or CVD processes. The measuring system makes a simple separation of measuring and coating possible, even during a continuous coating process. An arrangement of the light sender tightly under the substrate carrier makes short light paths possible and thereby a high light output and low signal noise.

With an arrangement of the light-receiver unit outside the vacuum chamber in a preferred embodiment of the invention, the measuring system is particularly suitable for processes that run under high process temperatures. Nevertheless, the measuring system is relatively insensitive to mechanical distortion of the vacuum tank or local shifts of individual structural parts during evacuation, heating, and running of the steam source and/or the ion or plasma source. The shutter thereby protects the light sender and the measuring window of the vacuum chamber against unwanted coating, and it prevents influence from outside light in the measuring system through the coating source and/or the plasma or ion source.

If a shutter arranged between coating source and substrate carrier is provided in the vacuum chamber for shading or layer thickness distribution, this is used at the same time as a shutter for the measuring system in a preferred embodiment of the measuring system.

In another preferred embodiment, the light sender is attached directly on the side of the shutter turned toward the coating source, making additional fasteners unnecessary.

If the substrate carrier, preferably structured as a spherical calotte, is revolving about an axis during coating, the substrates or at least one substrate are/is arranged for transmission measuring on a radius of the substrate carrier, whereby it is not excluded that further substrates for coating are arranged outside this radius on the calotte. The light sender is arranged under the substrate carrier in such a way that the substrates on the radius cross the optical path between the light-sender and light-receiver unit in one rotation of the substrate carrier, and an intermittent transmission measurement can be made with each revolution.

In preferred embodiments of the invention, the light sender can be set up directly as a light source arranged in the vacuum chamber or as a light guide that directs light from a light source located outside the vacuum chamber into the vacuum chamber. If the light sender is realized as a light source in the vacuum chamber, the power supply to the light source can be made through the existing vacuum power setup of the vacuum chamber. With a setup of the light sender as light guide, an additional vacuum setup is provided in the vacuum chamber for the light guide. A setup with the light guide arranged in the vacuum chamber especially makes the use of any light sources with wide spectral ranges and high luminescence possible, for example halogen lamps, deuterium lamps, and xenon lamps, as well as the injection of chopped light, by which the measurement precision is enhanced and influences from outside light can be compensated. Preferably, the light sender set up as a light guide is guided from below by a hole in the shutter and is attached to the shutter or to the shutter holder.

Preferably, the measuring system has, especially in an arrangement of the light source in the vacuum chamber, a broadband light source, especially a halogen lamp, so that broadband monitoring for optical coatings is possible, preferably in the spectral range from 400 nm to 1800 nm. Furthermore, it is advantageous for protection of the light source to arrange this in a housing. The housing can have, in another preferred embodiment for an enhanced light output of the light source, a collimator, a displaying lens system, and/or a reflector.

Since a halogen lamp emits light in the range from about 350 nm to 3000 nm, a limitation of the spectral range for monitoring is provided mainly by the light detector used, particularly by its signal noise. With standard Si light detectors, for example, good noise margins are achieved in the range from 400 nm to 1100 nm. With standard InGaAs light detectors, the range from 1000 nm to 1700 nm can be easily detected. For the UV range (350 nm to 400 nm), a PMT light detector would be suitable, for example.

To receive the light sent by the light sender, the light-receiver unit preferably has a light guide with a collimator lens. In an implementation of the light-receiver unit with a light guide, there is a possibility to arrange this inside the vacuum chamber, above the substrate carrier, whereby a vacuum setup is provided in the vacuum chamber, or the vacuum set-up of a light sender realized as a light guide can be used. Furthermore, there is the possibility that the light-receiver unit is arranged outside the vacuum chamber in the optical path of the light sender across a measuring window of the vacuum chamber.

In another preferred embodiment of the invention, the light-receiver unit is connected to a light detector unit, whereby the light detector unit comprises a light detector and a dispersing element, particularly a monochromator. The light wavelength of the light guided to the light detector is adjustable with the dispersive element, so that spectral photometric measurements are possible. A polychromatic with a line-light detector can be used as well, instead of a monochromator. Then a diode or CCD line is illuminated by an optical grid. Each single element of the line-light detector is illuminated at another wavelength. Thus, an entire wavelength spectrum can be measured simultaneously, and broadband monitoring is possible.

For further treatment of light intensities detected by the light detector, the signals adjacent to the exit of the light detector are preferably amplified and digitized by means of an A/D converter and transmitted to the processor unit connected to the light detector unit for further processing.

The light-receiver unit is arranged and adjusted in a preferred embodiment across a measuring window of the vacuum chamber so it can receive light from the light sender. For exact adjustment of the light-receiver unit on the optical path of the light sender, the light-receiver unit connected to the vacuum chamber is advantageously equipped with adjustment means, particularly a holding device, that can be fastened to the vacuum chamber and permits a tilt of the light-receiver unit about at least one axis.

In order to make an exact measurement of layer thicknesses of steamed layers on the substrate possible during the coating process, it is advantageous to record the light intensity of the light source in a reference phase, the light intensity of the light transmitted from the substrate in a measuring phase, and residual intensity in at least one dark phase, one after another, with a light detector, and derive a value from that for the transmission of the coated substrate. From the recorded values, a differential value is arrived at, preferably from each of the measuring and dark phases as well as the reference and dark phases. The relationship between the differential values thus determined $(I_{meas}-I_{dark}/I_{ref}-I_{dark})$ forms a measurement for the transmission of the coated substrate. Then fluctuations of light-source and detector sensitivity can be compensated.

In a preferred embodiment of the measuring system, the substrate carrier is structured for the adjustment of measuring, reference, and dark phases. The substrate carrier has at least one opening to clear a reference light path and at least one dark area to interrupt the optical path between the light source and the light-receiver unit.

Furthermore, it is preferable if the processor unit is connected to a rotation mechanism for the revolving substrate carrier to record the position of the substrate arranged on the substrate carrier for the measuring phase, the position of the opening for the reference phase, and the position of the dark area for the dark phase. This is possible with an incremental encoder coupled to the rotation mechanism that sets a counter to a defined value with each revolution at a defined angle of rotation and sends a pulse to the counter depending on the angle of rotation. Thus an angle of rotation and a position of the substrate, the opening, and the dark area can always be assigned to the counter reading. The counter reading is evaluated by the processor unit, and from that, signals are directed to control of the light-detector unit for recording measurement values in the reference, measuring, and dark phases.

BRIEF DESCRIPTION OF THE DRAWINGS

The invention will be described in more detail by means of an embodiment example. For this.

DETAILED DESCRIPTION OF THE INVENTION

Figure 1:
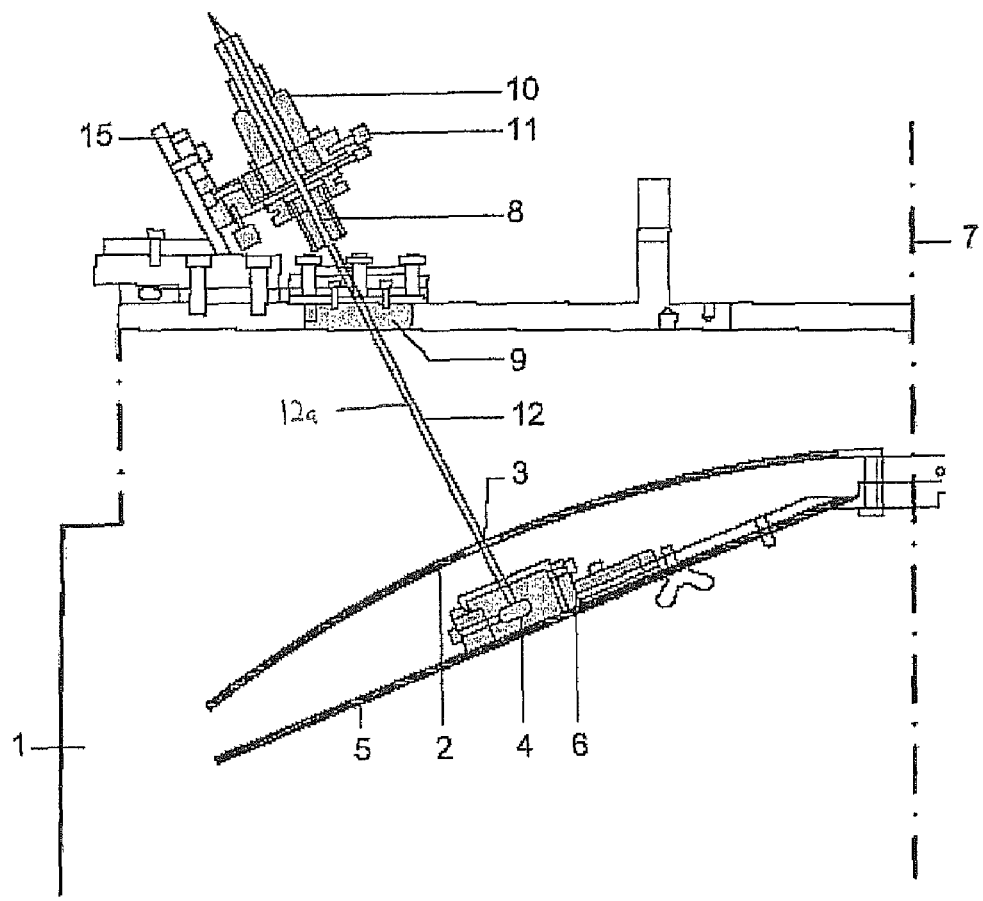
FIG. 1 shows a schematic representation of a model measuring system.

The model measuring system will be described for transmission measurement of steam-applied coated substrates 3 in a vacuum chamber 1. The substrates 3 to be coated are arranged on calotte-shaped substrate carrier 2 that revolves about an axis 7 during the coating of the substrates 3 by a coating source (not shown). A shutter 5 is mounted tightly underneath the substrate carrier 2 to optimize the layer-thickness distribution.

A broadband halogen lamp is provided as a light source 4 for the measuring system, which is located in a housing 6 and directly under the substrate carrier 2 on the shutter 5. The housing 6 is then structured so that the light of the halogen lamp can escape as a directed light beam. The shutter 5 for the layer-thickness distribution is used here at the same time as a shutter 5 for the measuring system. Power to the light source 4 is implemented with an electric cable with a vacuum.

The light-receiver unit 10 is mounted with a holding device 15 through the measuring window 9 of the vacuum chamber 1. The light guide 8 with a collimator lens is aligned exactly on the optical path/reference light path 12/12a of the light beam of the light source 4. The received light is focused in the light guide 8 and further directed to a light detector unit. For the exact alignment of the light-receiving unit 10, this adjustment means 11 has adjusting screws, for example, by means of which the light-receiving unit 10 can be exactly positioned. In the light-detector unit with a detector array, the received light signals are amplified and digitized and can be transmitted to a processor unit for evaluation.

The light source 4 and a vacuum window 9 are protected from undesirable coating by the shutter 5. Additionally, the light-receiver unit is blocked from outside light from the steam source.

Figure 2:
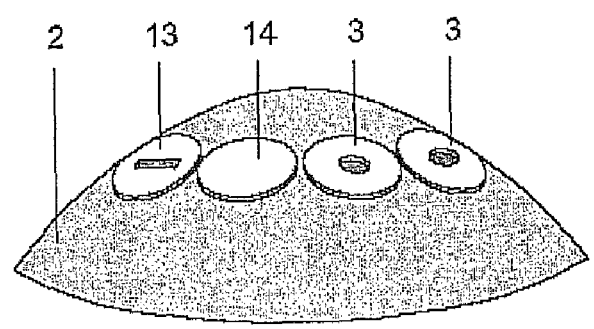
FIG. 2 shows a segment of a substrate carrier for making the measurement, reference and dark measurements.

A segment of the substrate carrier 2, as shown in FIG. 2, is provided with several measuring elements for substrates 3, for an opening 13, and for a dark area 14 for making measurement, reference, and dark measurements, whereby the measuring elements are arranged on a radius of the substrate carrier 2 that cuts the optical path 12. On other segments of the calotte-shaped substrate carrier 2, other substrates 3 can also be arranged for coating. During one revolution of the substrate carrier 2, a measurement can be made, at least in one measuring phase, of the light transmitted from a substrate 3, a measurement in a reference phase of light beamed directly from the light source 4 through the opening 13, and a measurement in a dark phase near the light source 4 concealed by the dark area 14.

The rotation mechanism of the substrate carrier 2 is connected to the processor unit through an incremental encoder tightly coupled to the rotating mechanism and a counter to record the position of the substrate 3 arranged on the substrate carrier 2 for the measuring phase, the position of the opening 13 for the reference phase, and the position of the dark area 14 for the dark phase, and for synchronization of the light detector unit linked to the light-receiver unit 10 with the rotating substrate carrier.

The light signals are evaluated in the processor unit in which a value for the transmission of the coated substrate 3 is derived from the signals in the measuring, reference, and dark phases.

The invention claimed is:

1. A measuring system for optical monitoring of coating processes in a vacuum chamber, particularly for layer thickness measurement of layers applied to substrates during the coating process, the system comprising:
   a light sender,
   a light-receiver unit arranged in an optical path of the light sender and
   a substrate carrier that can be moved in the vacuum chamber with at least one substrate, by which at least one substrate can be positioned in the optical path between the light sender and the light-receiver unit,
   wherein the light sender inside the vacuum chamber is arranged between the substrate carrier and a shutter,
   the shutter is arranged underneath the substrate carrier, whereby the shutter shades off a measuring area,
   wherein the substrate carrier revolves about an axis, whereby at least one substrate is arranged on a radius of the substrate carrier; and
   wherein the substrate carrier has at least one opening to clear a reference light path between the light source and the light-receiving unit, whereby the opening is arranged on the same radius as the substrate.

2. A measuring system according to claim 1, wherein the light sender includes a light source.

3. A measuring system according to claim 2, wherein the light source is a broadband light source.

4. A measuring system according to claim 2, wherein the light source is arranged in a housing.

5. A measuring system according to claim 1, wherein the light sender is fastened to a side of the shutter turned away.

6. A measuring system claim 1, wherein the light-receiving unit has a light guide.

7. A measuring system according to claim 1, wherein the light-receiving unit is arranged outside the vacuum chamber.

8. A measuring system according to claim 1, wherein the light-receiving unit is arranged across a measuring window of the vacuum chamber.

9. A measuring system according to claim 1, wherein the light-receiving unit has an adjustment means.

10. A measuring system according to claim 1, wherein the light-receiving unit is coupled to a light detector unit that includes a light detector, whereby a wavelength of the light supplied to the light detector is adjustable.

11. A measuring system according to claim 10, wherein the light detector unit is configured for the evaluation of light signals on the light-detector unit.

12. A measuring system according to claim 1, wherein the substrate carrier revolves about an axis, whereby at least one substrate is arranged on a radius of the substrate carrier.

13. A measuring system according to claim 12, wherein the substrate carrier is a spherical calotte.

14. A measuring system according to claim 12, wherein a rotation mechanism of the revolving substrate carrier is configured to record the revolving motion of the substrate carrier.

15. A measuring system according to claim 14, wherein the substrate carrier and the light-detector unit are configured to produce a measuring phase, a reference phase, and at least one dark phase.

16. A measuring system according to claim 14, wherein the substrate carrier and the light-detector unit are configured to produce a measuring phase, a reference phase, and at least one dark phase.

17. A measuring system for optical monitoring of coating processes in a vacuum chamber, particularly for layer thickness measurement of layers applied to substrates during the coating process, the system comprising:
   a light sender,
   a light-receiver unit arranged in an optical path of the light sender and
   a substrate carrier that can be moved in the vacuum chamber with at least one substrate, by which at least one substrate can be positioned in the optical path between the light sender and the light-receiver unit,
   wherein
   the light sender inside the vacuum chamber is arranged between the substrate carrier and a shutter,
   the shutter is arranged underneath the substrate carrier, whereby the shutter shades off a measuring area,
   wherein the substrate carrier is a spherical calotte,
   wherein the substrate carrier revolves about an axis, whereby at least one substrate is arranged on a radius of the substrate carrier,
   wherein the substrate carrier has at least one dark area to the interrupt the optical path between the light source and the light-receiving unit, where the dark area is arranged on the same radius as the substrate.

18. A measuring system according to claim 17, wherein the light sender includes a light source.

19. A measuring system according to claim 18, wherein the light source is a broadband light source.

20. A measuring system according to claim 18, wherein the light source is arranged in a housing.

21. A measuring system according to claim 17, wherein the light sender is fastened to a side of the shutter turned away.

22. A measuring system claim 17, wherein the light-receiving unit has a light guide.

23. A measuring system according to claim 17, wherein the light-receiving unit is arranged outside the vacuum chamber.

24. A measuring system according to claim 17, wherein the light-receiving unit is arranged across a measuring window of the vacuum chamber.

25. A measuring system according to claim 17, wherein the light-receiving unit has an adjustment means.

26. A measuring system according to claim 17, wherein the light-receiving unit is coupled to a light detector unit that includes a light detector, whereby a wavelength of the light supplied to the light detector is adjustable.

27. A measuring system according to claim 26, wherein the light detector unit is configured for the evaluation of light signals on the light-detector unit.

28. A measuring system according to claim 17, wherein the substrate carrier revolves about an axis, whereby at least one substrate is arranged on a radius of the substrate carrier.

29. A measuring system according to claim 28, wherein the substrate carrier is a spherical calotte.

30. A measuring system according to claim 28, wherein a rotation mechanism of the revolving substrate carrier is connected or can be connected with a processor unit to record the revolving motion of the substrate carrier.

31. Measurement arrangement for optically monitoring coating processes in a vacuum chamber in a coating plant for layer-thickness measuring of layers applied onto substrates during the coating process, comprising:
   a light emitter,
   a light receiver unit arranged in the beam path of the light emitter and
   a substrate holder which can move in the vacuum chamber, on which substrate holder at least one substrate to be coated is arranged or can be arranged and with which the at least one substrate can be positioned in the beam path between the light emitter and the light receiver unit, with the light emitter being arranged inside the vacuum chamber between the substrate holder and a shutter which is arranged underneath the substrate holder, the shutter shading a measurement region,
   wherein the light receiver unit is arranged outside the vacuum chamber and above the light emitter such that a measurement window of the vacuum chamber is arranged below the light receiver unit and between the light receiver unit and the light emitter, with the shutter protecting the measurement window against undesired coating and preventing extraneous-light influences and/or plasma or ion sources.

32. Method for optically monitoring coating processes in a vacuum chamber of a coating plant for layer-thickness measuring of layers applied onto substrates during the coating process, using an apparatus which comprises a light emitter, a light receiver unit arranged in the beam path of the light emitter and a substrate holder which can move in the vacuum chamber, on which substrate holder at least one substrate to be coated is arranged or can be arranged and with which the at least one substrate can be positioned in the beam path between the light emitter and the light receiver unit, with the light emitter being arranged inside the vacuum chamber between the substrate holder and a shutter which is arranged underneath the substrate holder, the shutter shading a measurement region,
   wherein the light receiver unit is arranged outside the vacuum chamber and above the light emitter such that a measurement window of the vacuum chamber is arranged below the light receiver unit and between the light receiver unit and the light emitter, with the shutter protecting the measurement window against undesired coating and preventing extraneous-light influences and/or plasma or ion sources.

* * * * *